United States Patent
Zheng et al.

(10) Patent No.: US 11,784,269 B2
(45) Date of Patent: Oct. 10, 2023

(54) INTERCONNECTION STRUCTURE BETWEEN SHINGLED SOLAR CELL SLICES AND SOLAR CELL WITH INTERCONNECTION STRUCTURE

(71) Applicant: TAIZHOU LERRISOLAR TECHNOLOGY CO., LTD, Taizhou (CN)

(72) Inventors: Zhi Zheng, Shanghai (CN); Shengbin Zhu, Taizhou (CN); Jinfei Miao, Taizhou (CN)

(73) Assignee: TAIZHOU LERRISOLAR TECHNOLOGY CO., LTD, Taizhou (CN)

( * ) Notice: Subject to any disclaimer, the term of this patent is extended or adjusted under 35 U.S.C. 154(b) by 115 days.

(21) Appl. No.: 16/472,926

(22) PCT Filed: Feb. 9, 2017

(86) PCT No.: PCT/CN2017/073158
§ 371 (c)(1),
(2) Date: Jun. 24, 2019

(87) PCT Pub. No.: WO2018/113076
PCT Pub. Date: Jun. 28, 2018

(65) Prior Publication Data
US 2019/0355859 A1 Nov. 21, 2019

(30) Foreign Application Priority Data
Dec. 23, 2016 (CN) .......................... 201611208154.5

(51) Int. Cl.
*H01L 31/05* (2014.01)
*H01L 31/0224* (2006.01)
(Continued)

(52) U.S. Cl.
CPC .. *H01L 31/0508* (2013.01); *H01L 31/022433* (2013.01); *H01L 31/0516* (2013.01);
(Continued)

(58) Field of Classification Search
CPC ......... H01L 31/0508; H01L 31/022433; H01L 31/0516; H01L 31/048; H01L 31/05;
(Continued)

(56) References Cited

U.S. PATENT DOCUMENTS

2003/0121228 A1* 7/2003 Stoehr ................. H01L 31/0512
52/518
2011/0277835 A1* 11/2011 Masson ........... H01L 31/022433
136/256
(Continued)

FOREIGN PATENT DOCUMENTS

| CN | 101826569 A | 9/2010 |
| CN | 102386254 A | 3/2012 |

(Continued)

*Primary Examiner* — Michael Y Sun
(74) *Attorney, Agent, or Firm* — Bayramoglu Law Offices LLC

(57) ABSTRACT

An interconnection structure used for sequentially bonding at least two cell slices and forming an excellent electrical connection. At least one of a front electrode and a back electrode of the cell slice is in a hollow structure, and the back electrode of the previous back electrode is connected with the front electrode of the next cell slice adjacent thereto through a conductive adhesive, thereby saving a large amount of front and back electrode paste, and reducing the cost of the shingled cell.

21 Claims, 8 Drawing Sheets

(51) Int. Cl.
  *H01L 31/048* (2014.01)
  *H01L 31/043* (2014.01)

(52) U.S. Cl.
  CPC .......... *H01L 31/043* (2014.12); *H01L 31/048* (2013.01); *H01L 31/05* (2013.01)

(58) Field of Classification Search
  CPC . H01L 31/043; H01L 31/049; H01L 27/1421; H01L 31/0203; H01L 31/022425; H01L 31/0481; H01L 31/0488; H01L 31/068; H01L 31/18; H01L 31/1804; H01L 31/186; H01L 31/1876; H01L 31/02008; H01L 31/042; H01L 31/0504; H01L 31/044; H01L 31/0201; Y02E 10/50; H02S 20/25; H02S 30/10; H02S 40/30; H02S 40/32; H02S 40/36; H02S 50/10; H02S 30/00; H02S 50/00; H02S 40/34; Y02B 10/12
  See application file for complete search history.

(56) References Cited

U.S. PATENT DOCUMENTS

2012/0125391 A1* 5/2012 Pinarbasi ............ H01L 31/0504
  136/244
2015/0349703 A1* 12/2015 Morad ................... H01L 31/05
  136/251
2016/0163888 A1* 6/2016 Reddy ............. H01L 31/022433
  136/256
2017/0194516 A1* 7/2017 Reddy ............. H01L 31/022433

FOREIGN PATENT DOCUMENTS

| | | | |
|---|---|---|---|
| CN | 103441156 A | | 12/2013 |
| CN | 103872150 A | | 6/2014 |
| CN | 203941912 U | | 11/2014 |
| CN | 104576773 A | | 4/2015 |
| CN | 204303822 U | | 4/2015 |
| CN | 104934489 A | | 9/2015 |
| CN | 105355693 A | * | 2/2016 |
| CN | 105789359 A | | 7/2016 |
| CN | 105870216 A | | 8/2016 |
| CN | 105932084 A | | 9/2016 |
| CN | 205657073 U | | 10/2016 |
| CN | 106129162 A | | 11/2016 |
| TW | 201611317 A | | 3/2016 |
| WO | 2015152020 A1 | | 10/2015 |

\* cited by examiner

INTERCONNECTION STRUCTURE BETWEEN SHINGLED SOLAR CELL SLICES AND SOLAR CELL WITH INTERCONNECTION STRUCTURE

CROSS REFERENCE TO THE RELATED APPLICATIONS

This application is the national phase entry of International Application No. PCT/CN2017/073158, filed on Feb. 9, 2017, which claims priority from Chinese Patent Application 201611208154.5, filed on Dec. 23, 2016, the entire contents of which are incorporated herein by reference.

TECHNICAL FIELD

The present invention belongs to the field of solar cell technologies, and more particularly, relates to an interconnection structure between shingled solar cell slices and a solar cell with the interconnection structure.

BACKGROUND

Solar cells refer to devices that can directly convert light energy into direct current using a photovoltaic effect. According to different photoelectric conversion materials, the solar cells include monocrystalline silicon, polycrystalline silicon, amorphous silicon film, cadmium telluride film, copper indium gallium tin film, gallium arsenide, fuel sensitization, perovskite, shingled cells, and other types. The crystalline silicon solar cells are the most common solar cells, including monocrystalline silicon solar cells and polycrystalline silicon solar cells.

A photovoltaic device that can be used for long-term use by electrically interconnecting a plurality of solar cells and then packaging the cells into a glass or organic polymer is called a photovoltaic module. A common method of interconnecting the cell slices in the crystalline silicon photovoltaic module is to arrange the cell slices in sequence, use a tin-coated solder strip containing a copper substrate as an interconnecting strip, weld one end of the interconnecting strip on a bus bar in a front side of a first cell slice, and weld the other end of the interconnecting strip on a bus bar in a back side of an adjacent second cell slice. The two ends of a second interconnecting strip are respectively welded on a bus bar in a front side of the second cell slice and a bus bar in a back side of a third cell slice, and so on. In this way, all the cell slices are connected in series into one string.

A shingled module employs another technique for interconnecting cell slices. One side of a solar cell slice A is placed under another cell slice B, so that an electrode on a front side of the cell slice A and an electrode on a back side of the cell slice B are overlapped with each other. The two electrodes are conductively connected by using a conductive material. Meanwhile, the cell slice B is placed under a cell slice C, so that an electrode on a front side of the cell slice B and an electrode on a back side of the cell slice C are overlapped with each other, and the two electrodes are conductively connected by using a conductive material. In the same manner, a plurality of cell slices can be sequentially interconnected to form a cell strings.

Patterns of electrodes on the front and back sides of the shingled cell slice are prepared by metallizing the surface of the solar cell. A common metallization method is to print a conductive paste containing silver particles on the surface of the cell by screen printing and sintering, and the pattern of the electrode can be changed by adjusting the screen graphics design of the screen printing.

A conductive material between the electrodes of the cell slice in the shingled module includes a conductive adhesive, a solder strip or a solder paste, etc. Corresponding preparation methods should be selected according to the characteristics of the conductive material. The conductive adhesive material can be prepared by dispensing or screen printing.

Prior art 1 related to the present invention:

Technical solutions of the prior art 1 are shown in the figures, wherein FIG. 1. is a design solution for front electrodes of a solar cell which is used for preparing solar cell slices, and FIG. 2 is a design solution for a back electrode of the solar cell. Each of the solar cell is cut into five small solar cell slices in a subsequent step, and each of the small solar cell slices has one electrode on the front and back sides respectively. This technical solution is characterized in that all the electrodes are made of silver paste in a solid and continuous pattern. FIG. 3 is a sectional view of a cell string of a conventional shingled solar cell module. As can be seen from FIG. 3, a width of a pattern of the conductive adhesive is smaller than that of the front and back silver electrodes, and a region where the conductive adhesive contacts the cell is completely inside the silver electrode region on the surface of the cell.

Defects of the prior art 1: this technical solution has the defects that the silver paste used for the front and back electrodes is relatively large, so the cost of the shingled solar cell module is relatively high.

Other Prior Art:

In addition to the solutions mentioned above, there are also other electrode design solutions for solar cells. Each cell can be cut into two, three, four, six, seven or eight slices in addition to five small cell slices. For chamfered monocrystalline silicon solar cells, an electrode design decision similar to that of FIG. 1 and FIG. 2 is employed, and the chamfered and unchamfered cells slices are respectively formed into a cell string. For square monocrystalline silicon or polycrystalline silicon solar cells, the conventional solutions include the one in which all the front electrodes are located on a right side of each cell slice and all the back electrodes are located on a left side of each cell slice, i.e., a front electrode of a rightmost slice in FIG. 1 is moved to a right end of the slice, and a back electrode of the same slice is moved to a left end of the slice.

What these electrode design solutions in the prior art have in common is that all the front and back electrodes used are solid silver electrodes. Therefore, all these design solutions have the defects of large consumption of silver paste and high cost.

SUMMARY

In order to solve the problems in the prior art, an object of the present invention is to provide a interconnection structure between shingled solar cell slices and a solar cell including the shingled solar cell slices. Through the structure, the consumption of silver paste can be greatly reduced and the cost of the shingled solar cell can be reduced.

The object of the present invention is achieved by the following technical solutions.

The present invention provides an interconnection structure between shingled solar cell slices for sequentially connecting at least two cell slices (4), wherein at least one of a front electrode and a back electrode of the cell slice is in a hollow structure, and the back electrode of the previous cell slice is connected with the front electrode of the next cell slice adjacent thereto by a conductive adhesive.

When the conductive adhesive is connected with the front electrode and the back electrode, the conductive adhesive is filled in a hollow region of the electrode having the hollow structure, and two side edges of the conductive adhesive are respectively bonded with electrode bodies on two sides of the hollow region of the electrode having the hollow structure.

The front electrode is in a fine grid structure, the back electrode is in a hollow structure, an upper surface of the conductive adhesive is bonded with the back electrode and the hollow region thereof, and a lower surface of the conductive adhesive is bonded with the front electrode and the cell slice near the front electrode.

At least one of the front electrode and the back electrode is in a segmented structure.

Segmented lengths of the electrode of the cell slice in at least one of a middle and two ends of the cell slice are greater than segmented lengths in the rest.

Each segment of the segmented structure has a length ranging from 0.5 mm to 30 mm.

The substrate of the cell slice is an N-type or P-type monocrystalline or polycrystalline silicon wafer.

The cell slice is a PERC solar cell slice, a heterojunction cell slice, a PERL cell slice, a TOPCon cell slice or a PERT cell slice.

The present invention further provides a solar cell including a plurality of cell slices, wherein the cell slices of the solar cell are sequentially connected through the forgoing structure.

Compared with the prior art, the present invention has the following beneficial effects.

According to the interconnection structure between shingled solar cell slices of the present invention, a large amount of electrode paste can be saved and the cost of solar cells formed from the shingled solar cell slices can be reduced by setting at least one of the front electrode and/or the back electrode in a hollow structure; moreover, the back electrode of a first cell slice is connected with the front electrode of a second cell slice adjacent to the first cell slice through the conductive adhesive, which can not only form excellent mechanical adhesion and conductive connection with the electrode of the silver paste, but also form excellent adhesion with the substrate surface of the cell slice, such as a silicon nitride film layer or silicon material, so that the connection between the shingled solar cell slices is reliable and stable.

Further, when the conductive adhesive is connected with the front electrode and the back electrode, the conductive adhesive is filled in the hollow region of the electrode having the hollow structure, and the two side edges of the conductive adhesive are respectively bonded with the electrode bodies at the two sides of the hollow region of the electrode having the hollow structure, so that the connection reliability of the conductive adhesive and the electrode is ensured, the conductivity between the conductive adhesive and the electrode is also ensured, and the consumption of the conductive adhesive is saved as much as possible.

Further, setting at least one of the front electrode and the back electrode in the segmented structure can reduce the use of the conductive adhesive, further save the electrode paste and reduce the cost of the solar cell.

Further, the segmented lengths of the electrode of the cell slice in the middle and the two ends of the cell slice are greater than the segmented lengths in the rest, so that a bonding force of the two cell slices bonded by the conductive adhesive can be enhanced.

In conclusion, the interconnection structure between shingled solar cell slices and the solar cell formed from the shingled solar cell slices of the present invention can save a large amount of front and back electrode paste and reduce the cost of the solar cell. For a design solution with a sectionally hollowed back side, this design can also save the consumption of the conductive adhesive and reduce the cost of the solar cell.

Figure 1:
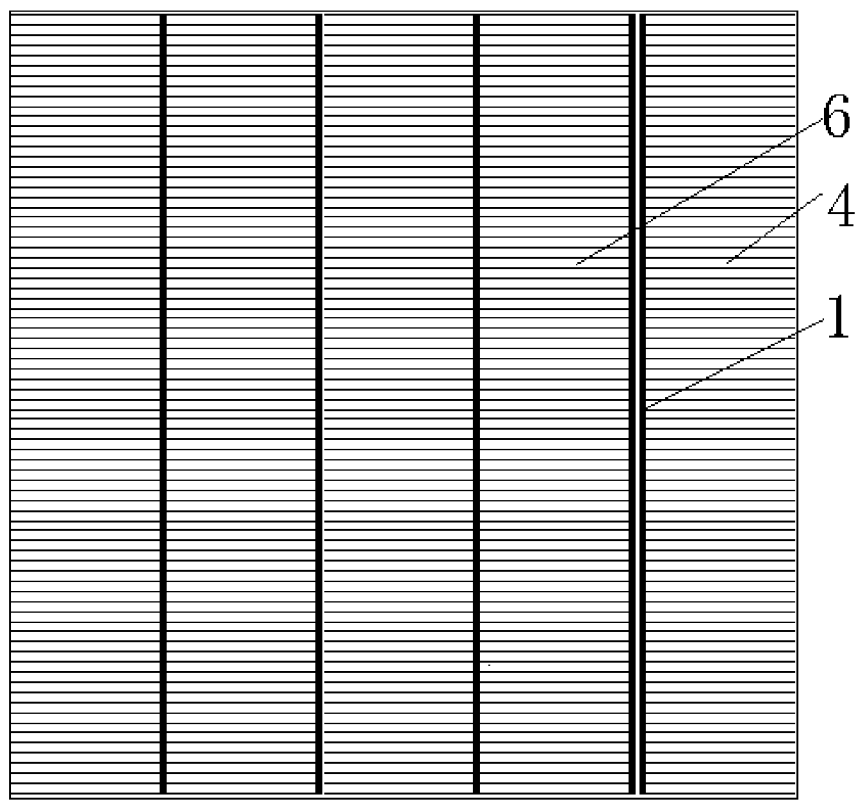
FIG. 1 is a design diagram illustrating a front electrode of a solar cell formed by shingled solar cell slices according to the prior art.
Figure 2:
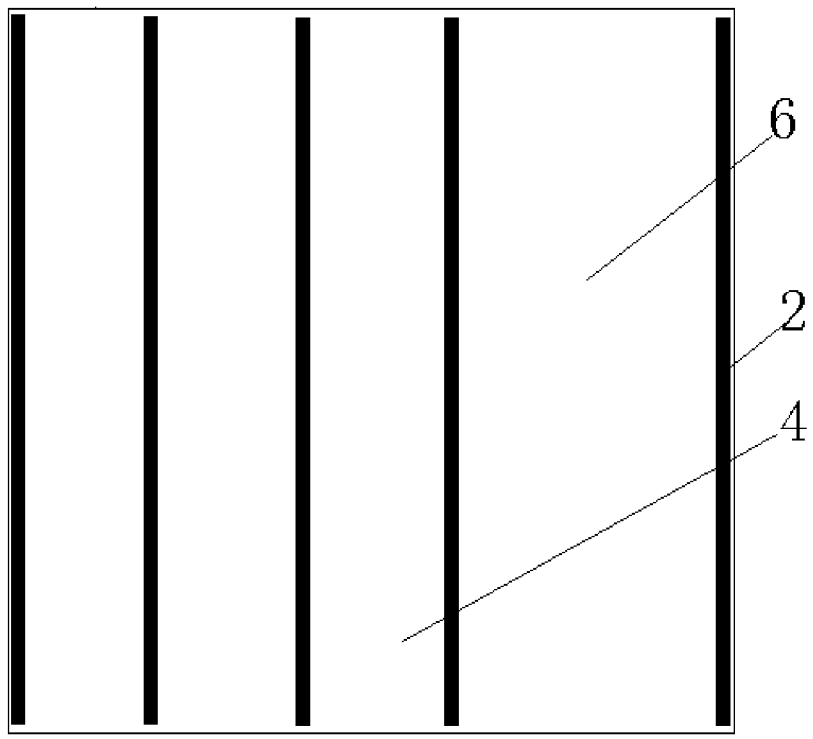
FIG. 2 is a design diagram illustrating a back electrode of the solar cell according to the prior art.
Figure 3:
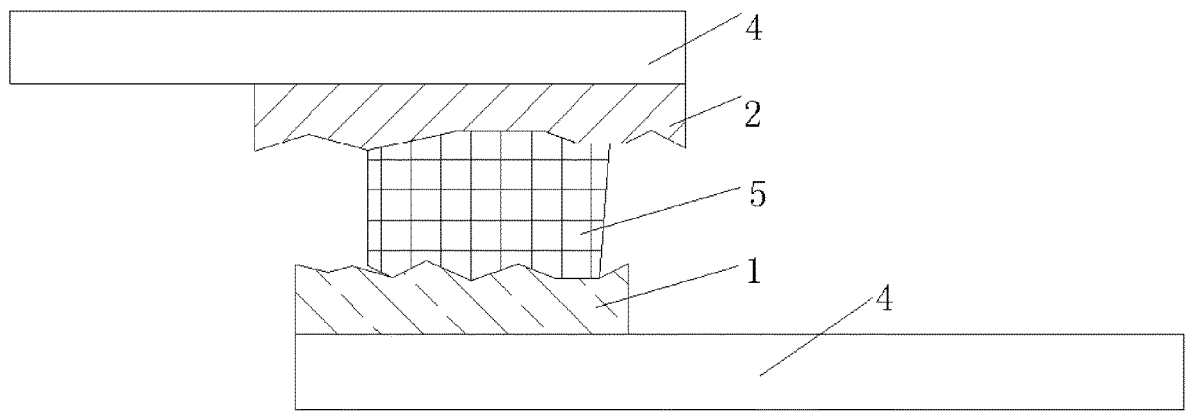
FIG. 3 is a schematic structure diagram illustrating a connecting portion between shingled solar cell slices according to the prior art.

1 refers to front electrode, 2 refers to back electrode, 3 refers to hollow region, 4 refers to cell slice, 5 refers to conductive adhesive, and 6 refers to solar cell.

DETAILED DESCRIPTION

The invention will be further described hereinafter in detail with reference to the drawings.

As shown in FIG. 13A to FIG. 15, the present invention provides an interconnection structure between shingled solar cell slices for sequentially connecting at least two cell slices 4, wherein the cell slice 4 is a PERC solar cell slice; when a conductive adhesive 5 is connected with a front electrode 1 and a back electrode 2, the conductive adhesive 5 is filled in a hollow region 3 of the electrode having a hollow structure, and two side edges of the conductive adhesive 5 are respectively bonded with electrode bodies on two sides of the hollow region 3 of the electrode having the hollow structure.

Figure 8:
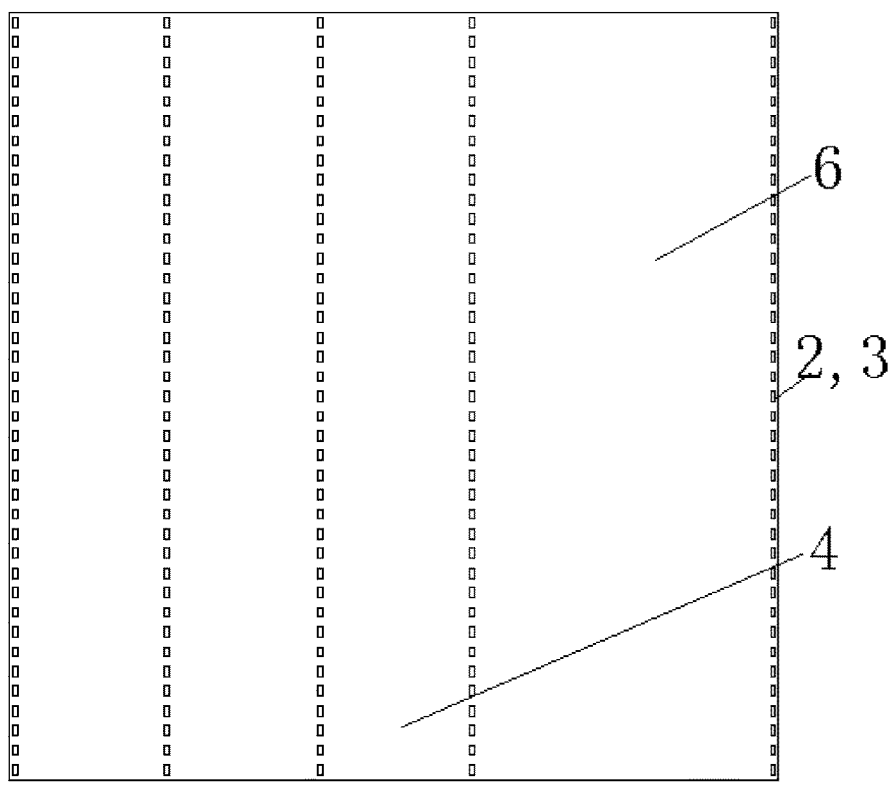
FIG. 8 is a segmented schematic diagram 2 of the back electrode according to an embodiment of the present invention.
Figure 9:
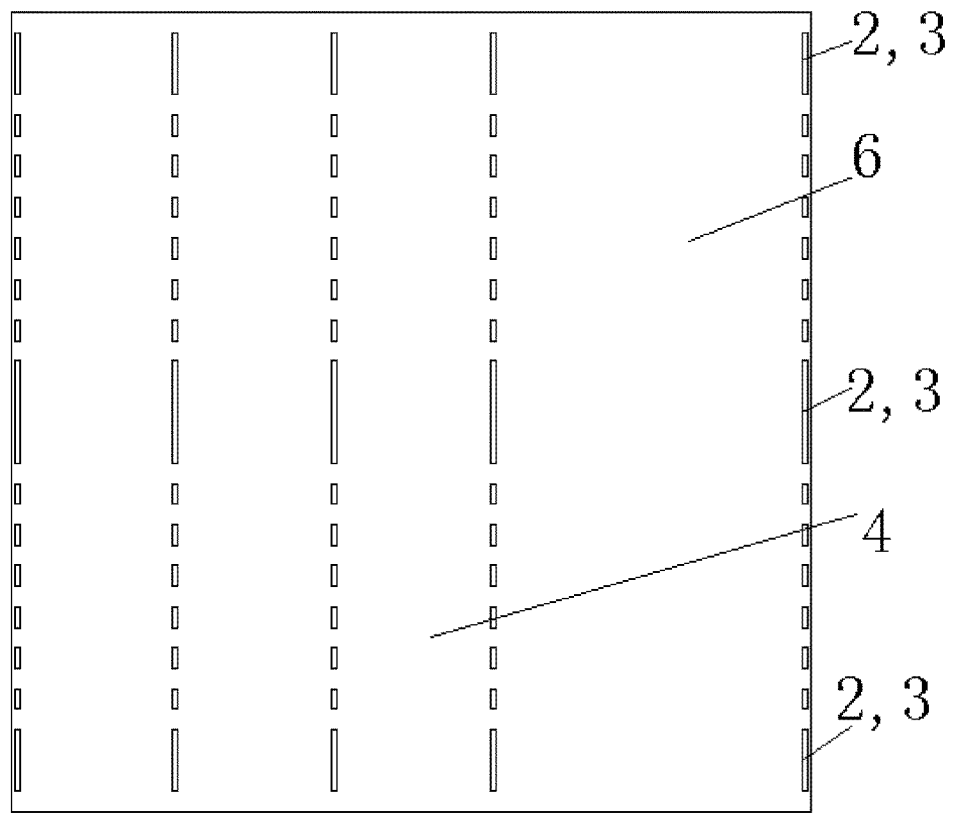
FIG. 9 is a segmented schematic diagram 3 of the back electrode according to an embodiment of the present invention.
Figure 10:
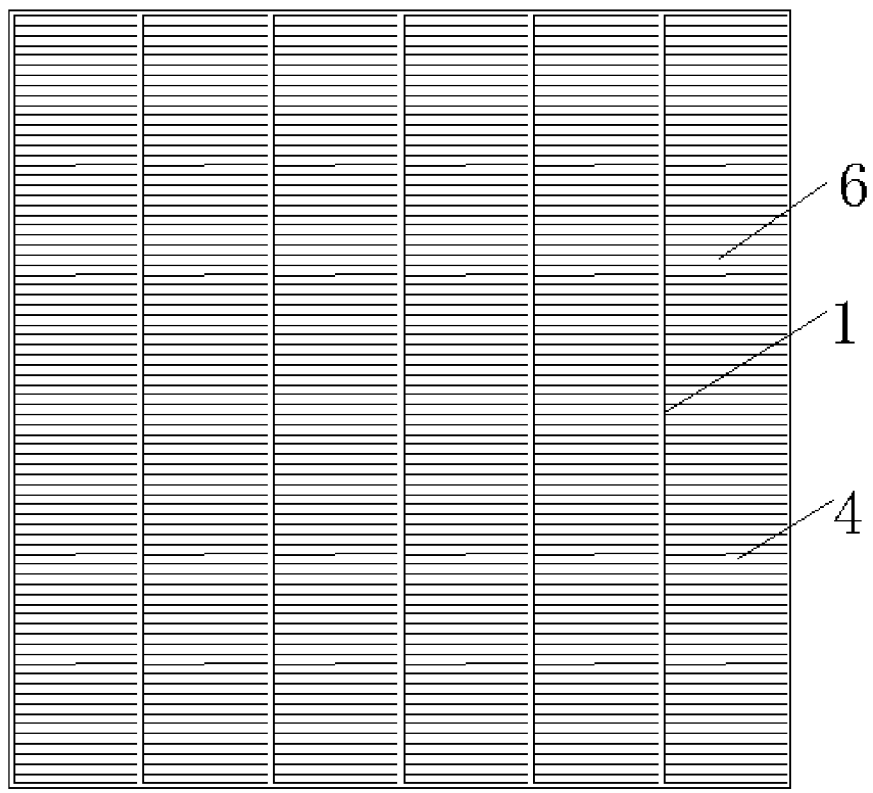
FIG. 10 is a schematic diagram illustrating a fine grid solution of the front electrode according to an embodiment of the present invention.
Figure 15:
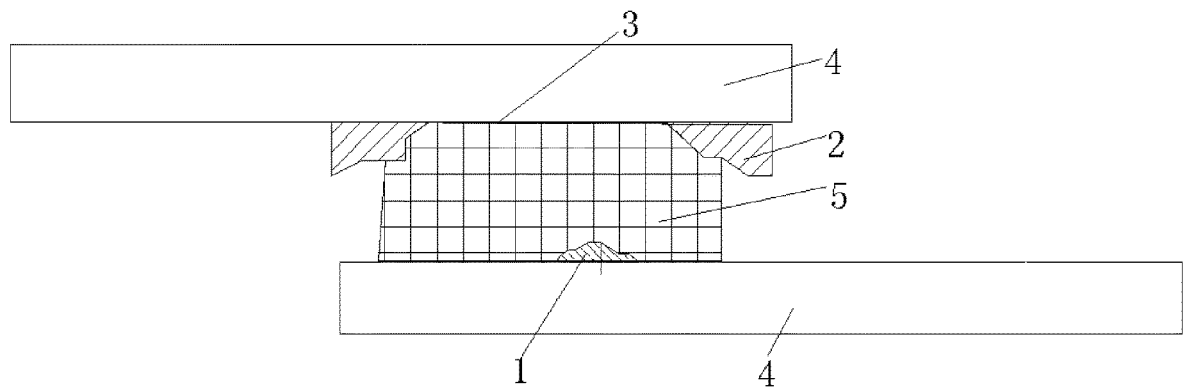
FIG. 15 is a sectional view of a cell string in the case where the front electrode is a fine grid and the back electrode is hollow according to an embodiment of the present invention.

As shown in FIG. 10 and FIG. 15, and together with FIG. 4 to FIG. 9, FIG. 11 and FIG. 12, the front electrode 1 is in a fine gate structure, and the back electrode 2 is in a hollow structure. An upper surface of the conductive adhesive 5 is bonded with the back electrode 2 and the hollow region, and a lower surface of the conductive adhesive is bonded with the front electrode 1 and a surface of a cell slice on which the front electrode is located.

As shown in FIG. 7 to FIG. 9, FIG. 12, FIG. 13B and FIG. 13D, at least one of the front electrode 1 and the back electrode 2 is in a segmented structure, and each segmented portion is also in a hollow structure.

As shown in FIG. 9, segmented lengths of the electrode of the cell slice 4 in a middle and two ends of the cell slice 4 are greater than segmented lengths in the rest, and each segment of the segmented structure has a length ranging from 0.5 mm to 30 mm.

As shown in FIG. 13A to FIG. 15, the present invention provides a solar cell, wherein the solar cell includes a plurality of shingled solar cell slices, which are sequentially connected through the forgoing interconnection structure.

The present invention is further elaborated below.

The present invention is particularly directed to such a conductive material such as a conductive adhesive. Compared with a common tin-coated copper strap, the conductive adhesive can not only form excellent mechanical adhesion and conductive connection with a silver paste, but also form excellent adhesion with other surfaces of the cell slice, such as silicon nitride film layer or silicon material.

In addition to an electrode region, a front surface of a crystalline silicon solar cell usually employs a silicon nitride film in a front side, and employs a screen printed aluminum paste in a back side usually. The silicon nitride film and the conductive adhesive can form perfect adhesion.

Figure 4:
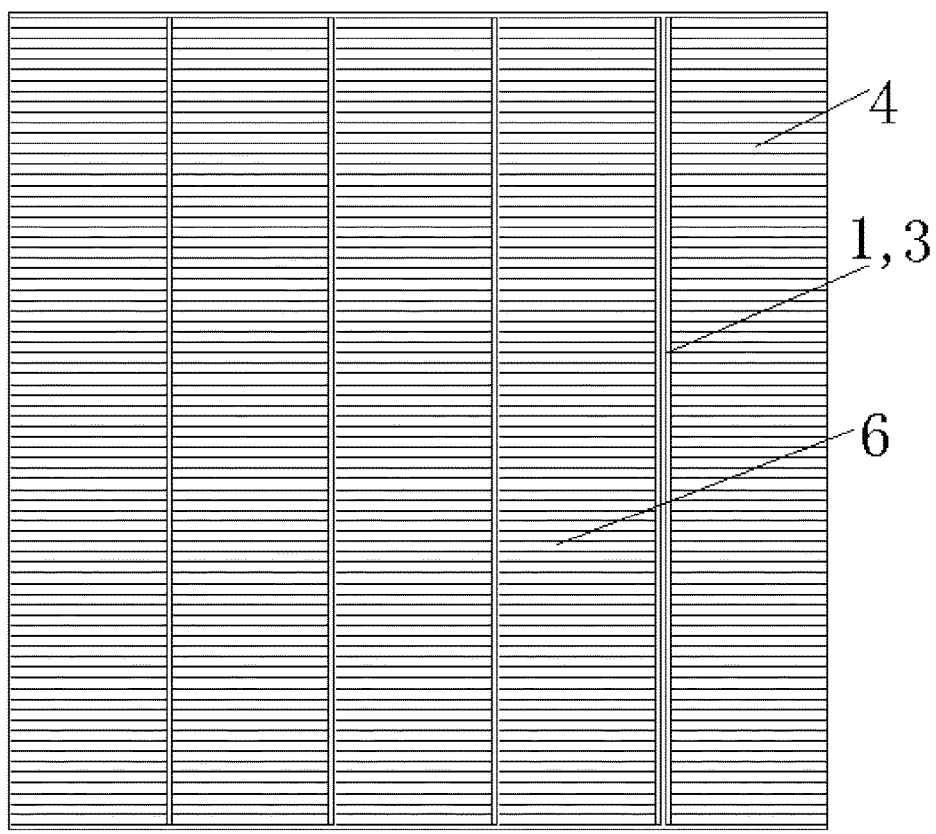
FIG. 4 is a schematic diagram of a front electrode according to an embodiment of the present invention.
Figure 5:
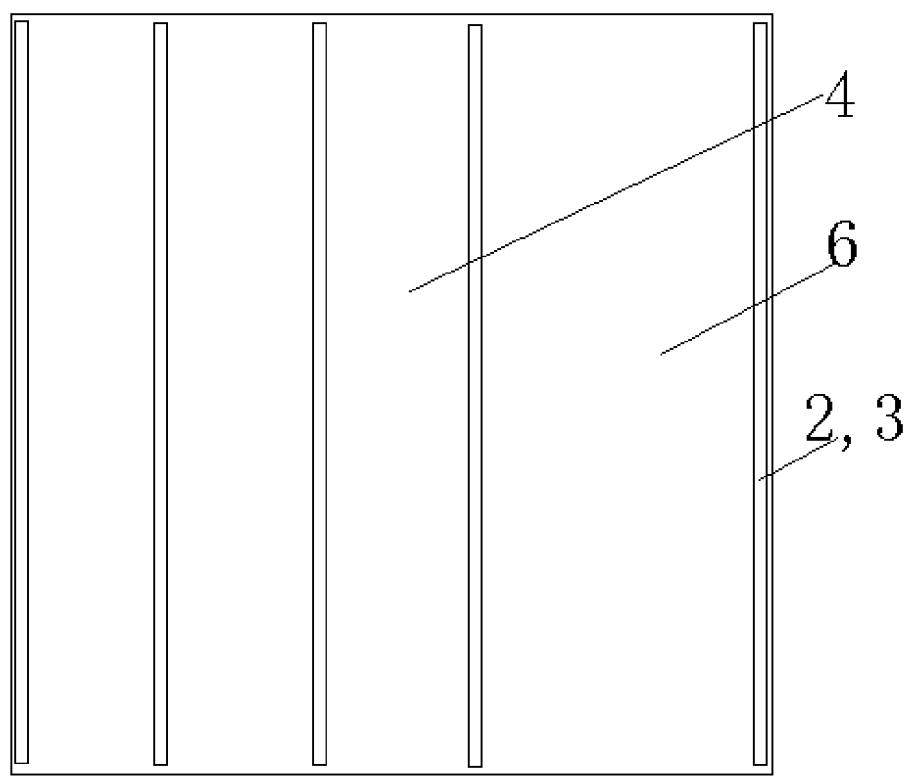
FIG. 5 is a schematic diagram of a back electrode according to an embodiment of the present invention.

As shown in FIG. 4 and FIG. 5, electrodes on front and back sides of a solar cell 6 are all hollow. For a front electrode 1, a surface of a hollow portion is a silicon nitride film; for a back electrode of a conventional cell, a surface of a hollow portion is silicon; and for a back electrode of a PERC cell, a surface of a hollow portion is a silicon nitride film. Both the silicon nitride films in the front and back sides of the solar cell 6 can be completed by a conventional coating process without additional process steps. With this design, a large amount of electrode paste can be saved and the cost of the solar cell can be reduced.

Figure 14:
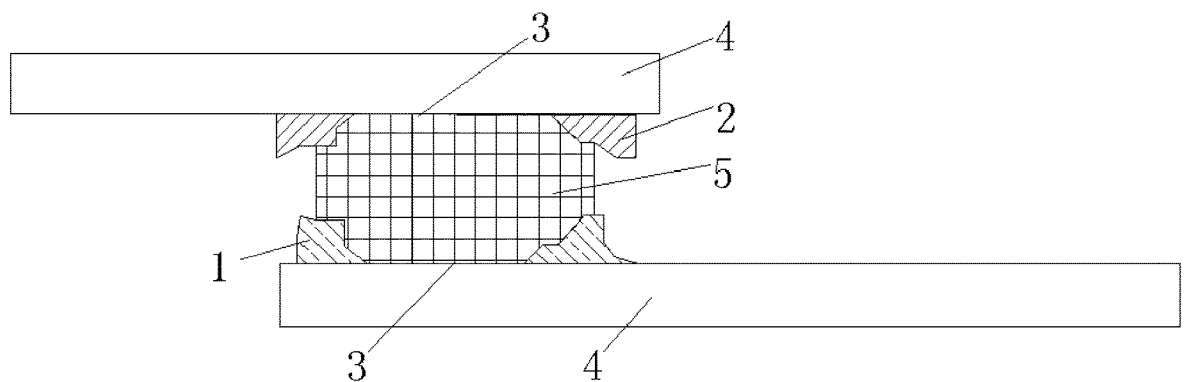
FIG. 14 is a sectional view of a cell string in the case where the front electrode and the back electrode are hollow according to an embodiment of the present invention.

As shown in FIG. 14, it can be seen that since both the front and back electrodes employ a hollow design, the conductive adhesive 5 is in direct contact with a non-electrode region of the cell slice 4 at the hollow region 3. For the lower cell slice, this region is a silicon nitride film layer, while for the upper cell slice, this region is the silicon material in the back side of the cell slice.

Figure 6:
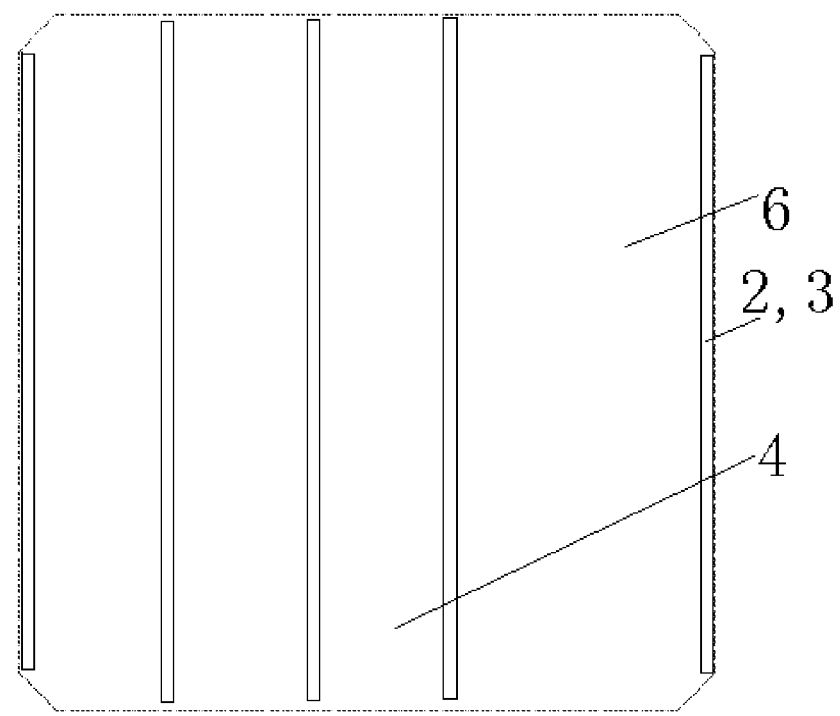
FIG. 6 is a schematic diagram illustrating a chamfered back electrode of a cell slice according to an embodiment of the present invention.

The above design can also be applied to a chamfered solar cell. FIG. 6 illustrates a design for a back electrode of a chamfered solar cell. Except that the four corners of the cell slice are chamfered, and a length of the electrode at the chamfered portion is shortened correspondingly, the other is the same as that of a square cell slice.

Figure 7:
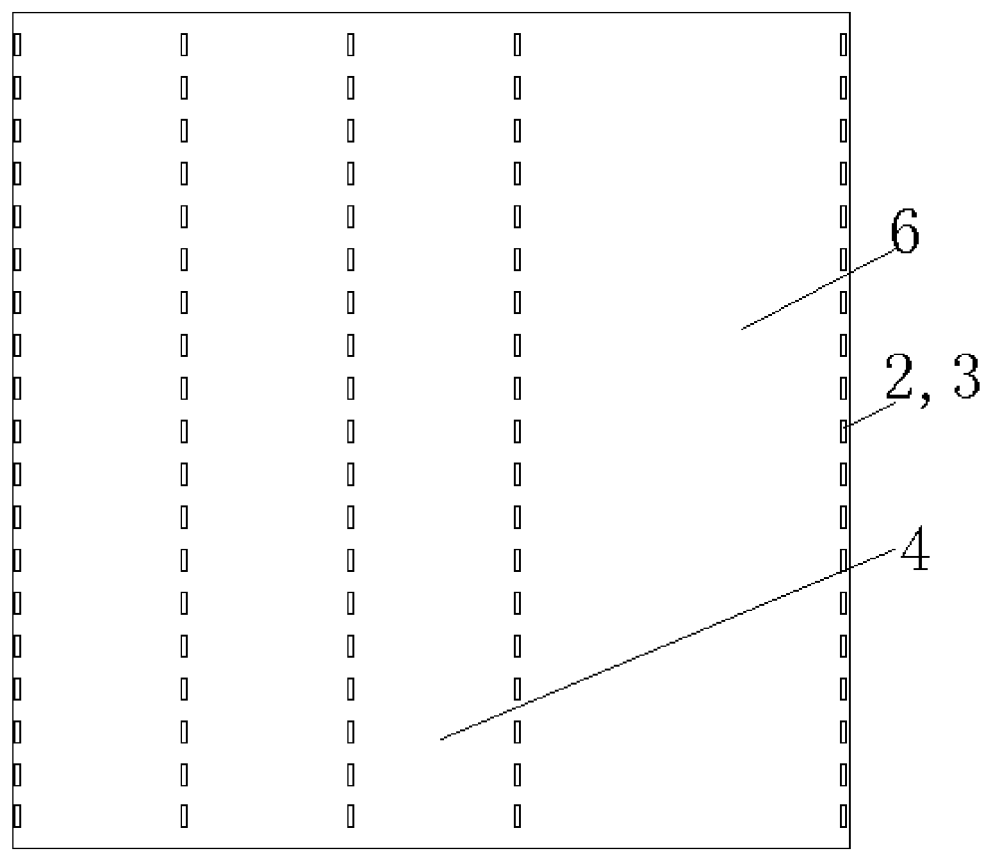
FIG. 7 is a segmented schematic diagram 1 of the back electrode according to an embodiment of the present invention.

The segmented design can also be employed in the back electrode 2 of the solar cell 6. As shown in FIG. 7, each segment of the electrode is still in a hollow design, and the conductive adhesive can penetrate all segments of the same back electrode, or a pattern of the conductive adhesive pattern can be segmented according to a pattern of the electrode. This solution is applicable to the way of printing the conductive adhesive by screen printing technology and the way of coating the conductive adhesive by a glue dispenser. Compared with the whole back electrode, this solution can save the electrode paste and reduce the cost. If the pattern of the conductive adhesive is also segmented, this solution can also save the conductive adhesive and further reduce the cost.

Similarly, the segmented design can also be employed in the front electrode 1 of the solar cell 6.

For the solution of employing the segmented design in the back electrode of the cell, the segmented electrode may have a length ranging from 0.5 mm to 30 mm, and a length of each segment can be the same or different.

As shown in FIG. 8, it is a short segmented electrode design.

FIG. 9 shows designs with different segment lengths. Electrode segments at upper and lower ends and a middle of the solar cell 6 are longer than other parts. For the solution that the pattern of the conductive adhesive is segmented along with the pattern of the electrode, this design can enhance a bonding force of two cell slices 4 bonded by the conductive adhesive.

As shown in FIG. 10, for the front electrode 1 of the solar cell 6, a fine grid design can also be employed in addition to the hollow design. The front electrode of the cell is a fine grid perpendicular to a secondary bus bar, and FIG. 11 is a design solution of the back electrode corresponding to this design.

Figure 11:
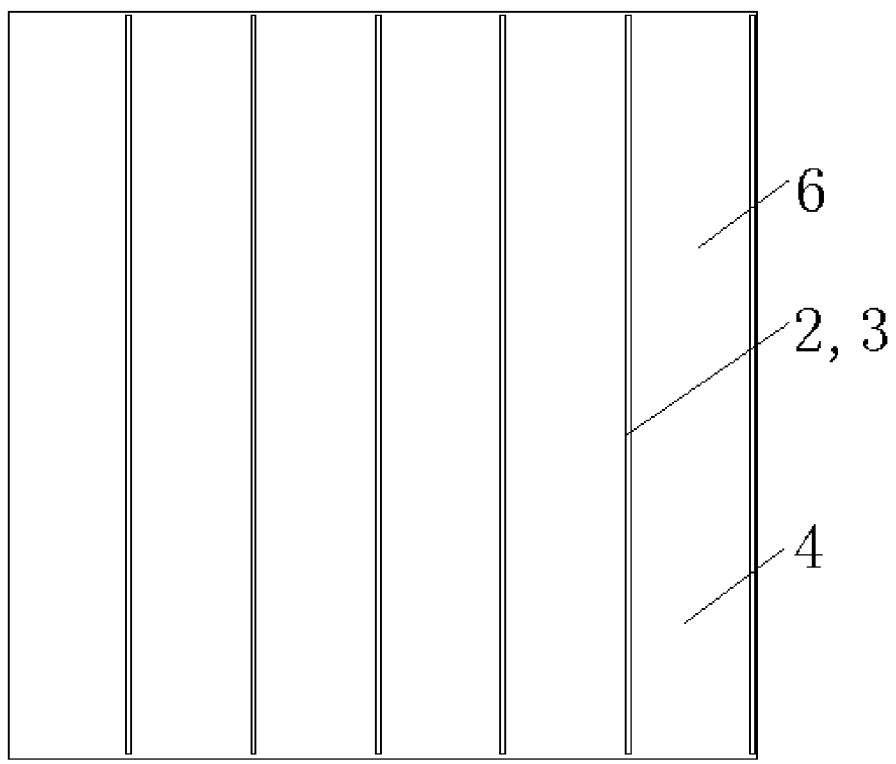
FIG. 11 is a schematic diagram illustrating a back electrode having a hollow structure according to an embodiment of the present invention.

As shown in FIG. 11, for the pattern design of the electrode of the solar cell, in addition to the solution of cutting one complete solar cell 6 into five cell slices 4, a design solution of cutting the complete solar cell 6 into two, three, four, six, seven or eight slices can also be employed, which is one of the solutions of cutting a monolithic PERC cell into six slices.

As shown in FIG. 4, for the pattern design of the electrode of the solar cell 6, the electrodes on the same sides of two adjacent cell slices 4 can be adjacent, such as the rightmost two front electrodes 1 in FIG. 4, or the electrodes may not be adjacent, such as the six front electrodes in FIG. 11.

Figure 12:
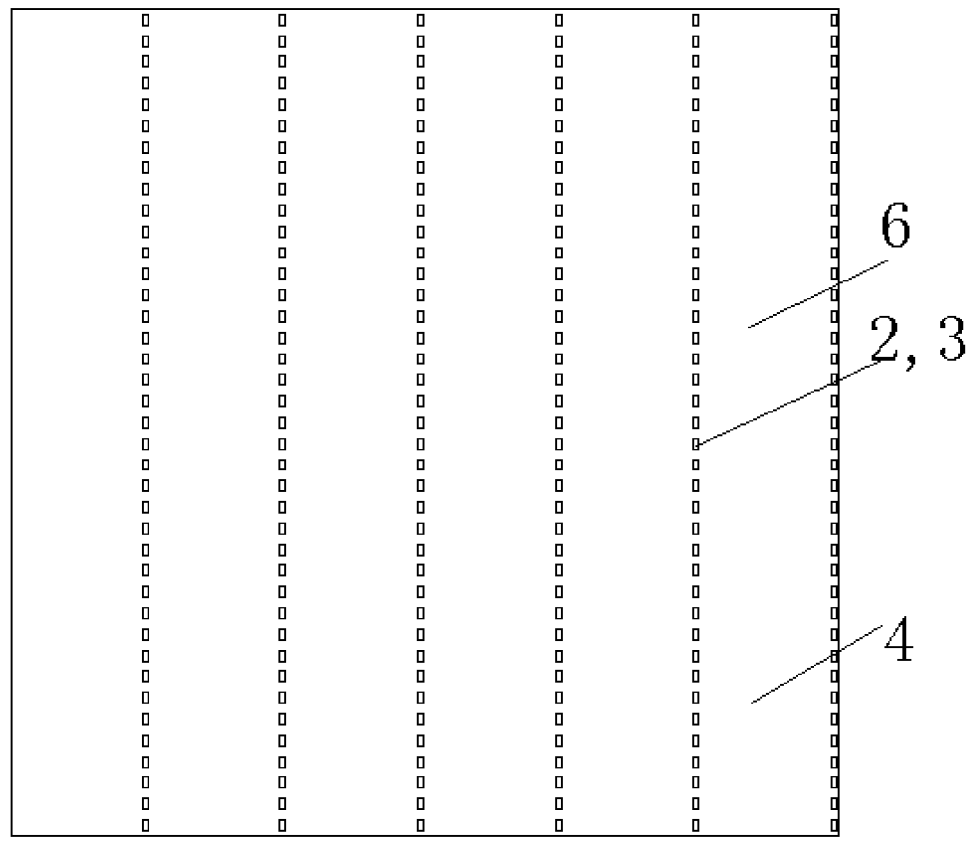
FIG. 12 is a segmented schematic diagram 4 of the back electrode according to an embodiment of the present invention.

As shown in FIG. 12, for a solar cell using a fine bus bar as the front electrode 1, the segmented design can also be employed in a back electrode of the cell, the segmented electrode may have a length ranging from 0.5 mm to 30 mm, and a length of each segment can be the same or different. That is, the electrode is a back electrode designed in a segmented manner.

Figures 13A, 13B:
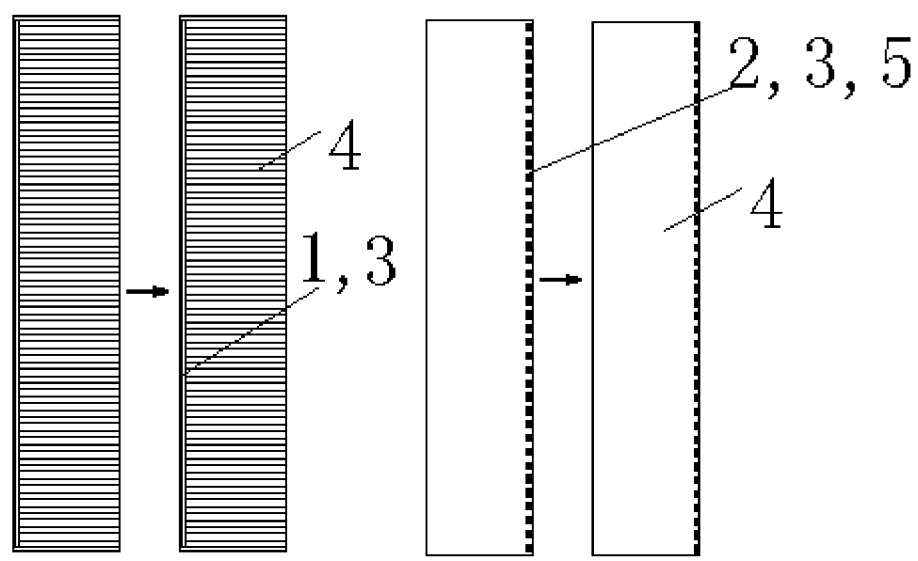
FIG. 13A is a front schematic diagram of two cell slices before shingling according to an embodiment of the present invention.
FIG. 13B is a back schematic diagram of two cell slices before shingling according to an embodiment of the present invention.
Figures 13C, 13D:
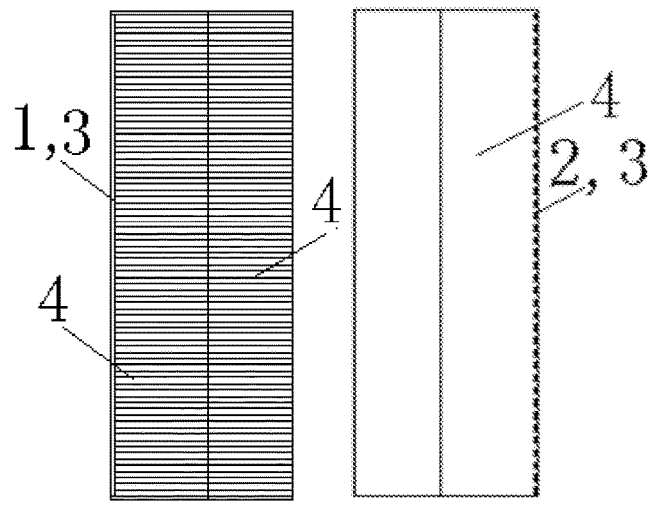
FIG. 13C is a front schematic diagram of two cell slices after shingling according to an embodiment of the present invention.
FIG. 13D is a back schematic diagram of two cell slices after shingling according to an embodiment of the present invention.

FIG. 13A to FIG. 13D show changes in appearances of two cell slices 4 before and after shingled. FIGS. 13A and FIG. 13C show the appearances of front sides of the two cell slices before and after shingled respectively. FIGS. 13B and FIG. 13D show the appearances of back sides of the two cell slices before and after shingled respectively. Before shingling, the conductive adhesive is coated on the back electrode, wherein the conductive adhesive is coated in a plurality of rectangular regions on the back side of the cell slice by screen printing. The conductive adhesive can also be applied to the front electrode by screen printing or dispensing.

As shown in FIG. 15, a hollow design is employed in the back electrode, and at the hollow region between the back electrodes of the upper cell slice, the conductive adhesive 5 is in direct contact with a silicon nitride film layer on the back side of the cell slice. A fine grid design is employed in the front electrode, and at the two sides of the front electrodes 1 of the lower cell slice, the conductive adhesive 5 is in direct contact with a silicon nitride film layer on the front side of the cell slice.

The design solution of the invention can save a large amount of front and back electrode paste and reduce the cost of the solar cell. For the design solution with a sectionally hollowed back side, this design can also save the consumption of the conductive adhesive and reduce the cost of the solar cell.

In addition to conventional crystalline silicon solar cells and PERC solar cells, electrode designs for heterojunction cells, TOPcon cells, PERL cells, PERT cells and other cell technologies can also be employed in the solution.

What is claimed is:

1. An interconnection structure between shingled solar cell slices for sequentially connecting cell slices, the interconnection structure comprising:
    at least two cell slices,
    wherein a front electrode and two back electrodes of each cell slice have a hollow structure and are provided with a hollow region;
    the two back electrodes of a first cell slice are connected with the front electrode of a second cell slice adjacent to the first cell slice by a conductive adhesive, with the entire front electrode positioned in between the two back electrodes;
    the conductive adhesive is in direct contact with a non-electrode region of each cell slice at the hollow region; and
    the conductive adhesive contacts an inner surface of the front electrode and an inner surface of the two back electrodes within the hollow region and the non-electrode region;
    wherein the conductive adhesive does not contact exterior side surfaces of the front electrode and the two back electrodes outside of the hollow region,
    wherein at least one of the front electrode or the two back electrodes has a segmented structure,
    wherein segmented lengths of at least one of a middle segment or segments at two ends of each cell slice are greater than segmented lengths of other segments in the segmented structure; and
    wherein a fine grid design is employed in the front electrode and at two sides of the front electrode of the lower cell slice, the conductive adhesive is in direct contact with a silicon nitride film layer on a front side of the cell slice.

2. The interconnection structure according to claim 1, wherein when the conductive adhesive is connected with the front electrode and the back electrode, the conductive adhesive is filled in the hollow region and two side edges of the conductive adhesive are respectively bonded with electrode bodies on two sides of the hollow region.

3. The interconnection structure according to claim 1, wherein the front electrode is in a fine grid structure, the back electrode has the hollow structure, an upper surface of the conductive adhesive is bonded with the back electrode of the first cell slice and a substrate at the hollow region of the back electrode of the first cell slice, and a lower surface of the conductive adhesive is bonded with the front electrode of the second cell slice and a surface of the second cell slice.

4. The interconnection structure according to claim 1, wherein each segment of the segmented structure has a length ranging from 0.5 mm to 30 mm.

5. The interconnection structure according to claim 1, wherein a substrate of each cell slice is an N-type or P-type monocrystalline or polycrystalline silicon wafer.

6. The interconnection structure according to claim 1, wherein each cell slice is a PERC solar cell slice, a heterojunction cell slice, a TOPCon cell slice, a PERL cell slice, or a PERT cell slice.

7. A solar cell, comprising:
    a plurality of cell slices, wherein the plurality of cell slices are sequentially connected;
    wherein a front electrode and two back electrodes of each cell slice have a hollow structure and are provided with a hollow region; and
    the two back electrodes of a first cell slice are connected with the front electrode of a second cell slice adjacent to the first cell slice by a conductive adhesive, with the entire front electrode positioned in between the two back electrodes; and
    the conductive adhesive is in direct contact with a non-electrode region of each cell slice at the hollow region,
    wherein at least one of the front electrode or the two back electrodes has a segmented structure,
    wherein segmented lengths of at least one of a middle segment or segments at two ends of each cell slice are greater than segmented lengths of other segments in the segmented structure; and
    wherein a fine grid design is employed in the front electrode and at two sides of the front electrode of the lower cell slice, the conductive adhesive is in direct contact with a silicon nitride film layer on a front side of the cell slice.

8. The solar cell according to claim 7, wherein the conductive adhesive is filled in the hollow region and two side edges of the conductive adhesive are respectively bonded with electrode bodies on two sides of the hollow region.

9. The solar cell according to claim 7, wherein the front electrode is in a fine grid structure, the back electrode has the hollow structure, an upper surface of the conductive adhesive is bonded with the back electrode of the first cell slice and a substrate at the hollow region of the back electrode of the first cell slice, and a lower surface of the conductive adhesive is bonded with the front electrode of the second cell slice and a surface of the second cell slice.

10. The solar cell according to claim 7, wherein each segment of the segmented structure has a length ranging from 0.5 mm to 30 mm.

11. The solar cell according to claim 7, wherein a substrate of each cell slice is an N-type or P-type monocrystalline or polycrystalline silicon wafer.

12. The solar cell according to claim 7, wherein each cell slice is a PERC solar cell slice, a heterojunction cell slice, a TOPCon cell slice, a PERL cell slice, or a PERT cell slice.

13. The interconnection structure according to claim 1, wherein segmented lengths of a middle segment and segments at two ends of each cell slice are greater than segmented lengths of other segments in the segmented structure.

14. The interconnection structure according to claim 13, wherein each segment of the segmented structure has a length ranging from 0.5 mm to 30 mm.

15. The solar cell according to claim 7, wherein segmented lengths of a middle segment and segments at two ends of each cell slice are greater than segmented lengths of other segments in the segmented structure.

16. The solar cell according to claim 15, wherein each segment of the segmented structure has a length ranging from 0.5 mm to 30 mm.

17. The interconnection structure according to claim 1, wherein each cell slice is a PERC solar cell slice, a TOPCon cell slice, a PERL cell slice, or a PERT cell slice.

18. The solar cell according to claim 7, wherein each cell slice is a PERC solar cell slice, a TOPCon cell slice, a PERL cell slice, or a PERT cell slice.

19. An interconnection structure between shingled solar cell slices for sequentially connecting cell slices, the interconnection structure comprising:
   at least two cell slices,
   wherein a front electrode and two back electrodes of each cell slice have a hollow structure and are provided with a hollow region;
   the two back electrodes of a first cell slice are connected with the front electrode of a second cell slice adjacent to the first cell slice by a conductive adhesive, with the entire front electrode positioned in between the two back electrodes;
   the conductive adhesive is in direct contact with a non-electrode region of each cell slice at the hollow region; and
   the conductive adhesive contacts an inner surface of the front electrode and an inner surface of the two back electrodes within the hollow region and the non-electrode region;
   wherein the conductive adhesive does not contact exterior side surfaces of the front electrode and back electrode outside of the hollow region,
   wherein at least one of the front electrode or the two back electrodes has a segmented structure of a plurality of segments, where each of the segments having a width and a length; and
   wherein segmented lengths of at least one of a middle segment and segments at two ends of each cell slice are greater than segmented lengths of other segments in the segmented structure.

20. The interconnection structure according to claim 19, wherein the segmented lengths of the at least one of a middle segment and the segments at the two ends of each cell slice are each 30 mm, and the segmented lengths of the other segments in the segmented structure are each 0.5 mm.

21. The interconnection structure according to claim 19, wherein the other segments are aligned between the at least one middle segment and each of the segments at the two ends of each cell slice.

* * * * *